(12) United States Patent
Saida et al.

(10) Patent No.: US 10,481,975 B2
(45) Date of Patent: Nov. 19, 2019

(54) MEMORY SYSTEM

(71) Applicant: TOSHIBA MEMORY CORPORATION, Minato-ku (JP)

(72) Inventors: Daisuke Saida, Shinagawa (JP); Hiroki Noguchi, Yokohama (JP); Keiko Abe, Yokohama (JP); Shinobu Fujita, Koto (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 144 days.

(21) Appl. No.: 15/699,200

(22) Filed: Sep. 8, 2017

(65) Prior Publication Data

US 2018/0267853 A1   Sep. 20, 2018

(30) Foreign Application Priority Data

Mar. 17, 2017  (JP) ................. 2017-053472

(51) Int. Cl.
*G11C 29/00* (2006.01)
*G06F 11/10* (2006.01)
(Continued)

(52) U.S. Cl.
CPC ...... *G06F 11/1068* (2013.01); *G11C 11/1673* (2013.01); *G11C 11/1675* (2013.01); (Continued)

(58) Field of Classification Search
CPC ............. G06F 11/1008; G06F 11/1044; G06F 11/0766; G06F 11/1048; G06F 11/0793;
(Continued)

(56) References Cited

U.S. PATENT DOCUMENTS 6,408,402 B1 * 6/2002 Norman .............. G02F 1/13318
257/E27.129
6,950,334 B2   9/2005 Shimizu et al.
(Continued)

FOREIGN PATENT DOCUMENTS

JP         3866701      1/2007
JP      2008-542662   11/2008
(Continued)

*Primary Examiner* — Guerrier Merant
(74) *Attorney, Agent, or Firm* — Oblon, McClelland, Maier & Neustadt, L.L.P.

(57) ABSTRACT

A memory system has a non-volatile memory, an error corrector, an error information storage, and an access controller. The non-volatile memory comprising a plurality of memory cells. The error corrector to correct an error included in data read from the non-volatile memory. The error information storage, based on an error rate when a predetermined number or more of data is written in the non-volatile memory and read therefrom, to store first information on whether there is an error in the written data, on whether there is an error correctable by the error corrector in the written data, and on whether there is an error uncorrectable by the error corrector in the written data. The access controller, based on the first information, to control at least one of reading from or writing to the non-volatile memory.

19 Claims, 18 Drawing Sheets

(51) Int. Cl.
*G11C 11/16* (2006.01)
*G11C 29/52* (2006.01)
*G11C 29/02* (2006.01)
*G11C 29/44* (2006.01)
*G11C 29/04* (2006.01)

(52) U.S. Cl.
CPC .......... *G11C 29/021* (2013.01); *G11C 29/028* (2013.01); *G11C 29/4401* (2013.01); *G11C 29/52* (2013.01); *G11C 29/70* (2013.01); *G11C 2029/0401* (2013.01); *G11C 2029/0409* (2013.01); *G11C 2029/4402* (2013.01)

(58) Field of Classification Search
CPC ............... G06F 11/0772; G06F 11/076; G06F 11/0727; G06F 3/0653; G06F 3/064; G06F 3/0619; G06F 3/0673; G06F 11/1024; G06F 11/1068; H03M 13/19; H03M 13/1515; G11C 11/1675; G11C 11/1673; G11C 29/52; G11C 29/021; G11C 29/4401; G11C 29/70; G11C 29/028; G11C 2029/4402; G11C 2029/0401; G11C 2029/0409
See application file for complete search history.

(56) References Cited

U.S. PATENT DOCUMENTS

| | | |
|---|---|---|
| 7,801,655 B2 | 9/2010 | Burker et al. |
| 8,717,840 B2 | 5/2014 | Higashi et al. |
| 9,159,423 B1* | 10/2015 | Brahmadathan ....... G11C 16/04 |
| 2002/0032891 A1* | 3/2002 | Yada .................... G06F 11/1068 714/766 |
| 2006/0080572 A1 | 4/2006 | Fong |
| 2008/0072120 A1* | 3/2008 | Radke ................ G06F 11/1068 714/768 |
| 2012/0239973 A1* | 9/2012 | Walton ................ G06F 11/0712 714/15 |
| 2014/0245105 A1* | 8/2014 | Chung ................. G06F 11/1048 714/763 |
| 2015/0058697 A1* | 2/2015 | Iwasaki ............... G06F 11/1048 714/773 |
| 2015/0067437 A1* | 3/2015 | Bains .................. G06F 11/1048 714/758 |
| 2016/0055056 A1* | 2/2016 | Son ..................... G06F 11/1068 714/764 |
| 2016/0188429 A1 | 6/2016 | Noguchi et al. |
| 2016/0224412 A1* | 8/2016 | Healy ................. G06F 11/1008 |
| 2016/0239663 A1* | 8/2016 | Healy .................. G06F 21/554 |
| 2016/0301428 A1* | 10/2016 | Andrade Costa ... G06F 11/1048 |
| 2016/0371189 A1 | 12/2016 | Noguchi et al. |
| 2017/0075756 A1 | 3/2017 | Noguchi et al. |

FOREIGN PATENT DOCUMENTS

| | | |
|---|---|---|
| JP | 2014-95989 | 5/2014 |
| JP | 5624573 | 11/2014 |
| JP | 2015-52938 | 3/2015 |
| JP | 2015-170202 | 9/2015 |
| JP | 2017-58953 | 3/2017 |

* cited by examiner

STUCK FLAG INFORMATION
    0 : NO ERROR
    1 : CORRECTABLE BIT ERROR PRESENT
    2 : UNCORRECTABLE BIT ERROR PRESENT

STUCK FLAG INFORMATION
    0 : NO ERROR
    1 : CORRECTABLE 1-BIT ERROR PRESENT
    2 : CORRECTABLE 2-BIT ERROR PRESENT
    3 : UNCORRECTABLE BIT ERROR PRESENT

MEMORY SYSTEM

CROSS REFERENCE TO RELATED APPLICATIONS

This application is based upon and claims the benefit of priority from the prior Japanese Patent Application No. 2017-53472, filed on Mar. 17, 2017, the entire contents of which are incorporated herein by reference.

FIELD

Embodiments relate to a memory system provided with a non-volatile memory.

BACKGROUND

It is considered to use large-capacity and high-speed non-volatile memories for a main memory, a cache memory, etc. Among the non-volatile memories, an MRAM (Magnetoresistive Random Access Memory) has non-volatility in view of data retention, and hence attracts attention as an alternative candidate for an SRAM (Static RAM), a RAM (Dynamic RAM), etc.

A part of the non-volatile memories such as the MRAM retains data logic utilizing a state change in constituent material and hence has a problem of a high error occurrence rate (hereinafter, an error rate) depending on a write voltage, access times, and aging degradation, and also an environmental change such as temperature and humidity.

It is thus considered, before shipping the non-volatile memories, to perform write to and reading from the non-volatile memories to perform screening for inspecting the error rate. It is also considered to replace a memory cell determined to have a high error rate by the screening with a redundant cell.

However, the MRAM shows change in write characteristics due to write conditions such as a write voltage, access times, aging degradation, and environmental conditions such as temperature and magnetic fields. Therefore, the error rate cannot be identified only by the screening before shipping.

Moreover, if a little more redundant areas are secured to foresee increase in error rate due to write conditions, aging degradation, environmental conditions, etc., the non-volatile memory area becomes large because of the redundant areas, so that high integration becomes difficult and a unit bit price increases inevitably.

DETAILED DESCRIPTION

A memory system according to one embodiment has a non-volatile memory, an error corrector, an error information storage, and an access controller. The non-volatile memory comprises a plurality of memory cells. The error corrector corrects an error included in data read from the non-volatile memory. The error information storage, based on an error rate when a predetermined number or more of data is written in the non-volatile memory and read therefrom, stores first information on whether there is an error in the written data, on whether there is an error correctable by the error corrector in the written data, and on whether there is an error uncorrectable by the error corrector in the written data. The access controller, based on the first information, controls at least one of reading from or writing to the non-volatile memory.

Embodiments will now be explained with reference to the accompanying drawings.

First Embodiment

Figure 1:
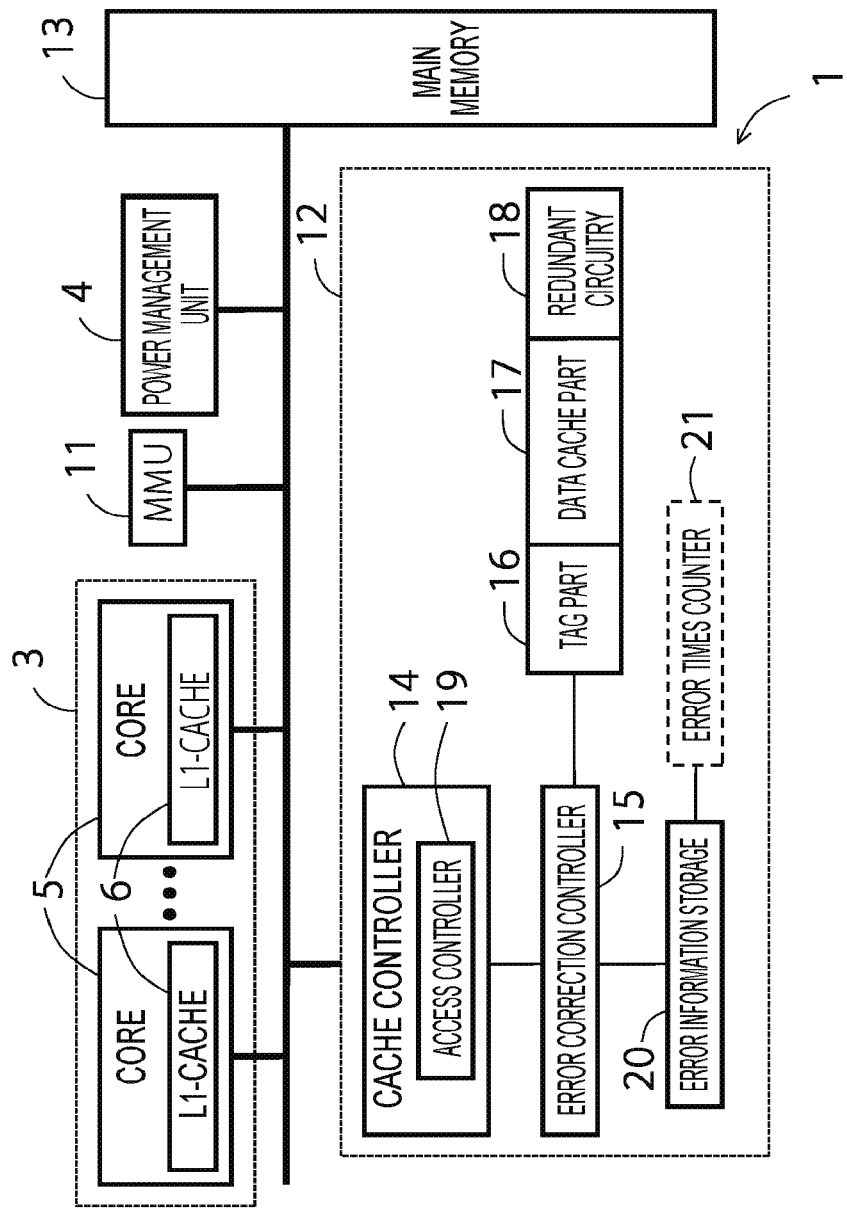
FIG. 1 is a block diagram schematically showing the configuration of a processor system provided with a memory system according to a first embodiment.

FIG. 1 is a block diagram schematically showing the configuration of a processor system 2 provided with a memory system 1 according to a first embodiment. The processor system 2 of FIG. 1 is provided with the memory system 1, a processor 3, and a power management unit 4.

The memory system 1 is connected to the processor 3 so as to be accessed by the processor 3. The processor 3 has a multi-core configuration with a plurality of cores 5. There is no particular limitation on the number of the cores 5. The processor 3 may have a single-core configuration with a single core 5. Each core 5 has an accumulator not shown and a first-level cache memory (hereinafter, L1-cache) 6. The processor 3 may have a built-in high-level cache memory such as a second-level cache memory (hereinafter, L2-cache) and those higher in level than the second-level cache memory. However, in the specification, an example in which the L1-cache 6 is only built in the processor 3 will be explained.

The power management unit 4 controls whether to supply power to each circuit block in the processor system 2. Moreover, the power management unit 4 may switch a power level to be supplied to the processor 3 in stages.

The memory system 1 of FIG. 1 is provided with a memory management unit (MMU) 11, a cache memory 12, and a main memory 13. The MMU 11 converts a virtual address issued by the processor 3 into a physical address. The MMU 11 refers to a page table not shown stored in the main memory 13 based on a history of memory addresses accessed by the processor 3 to acquire a page table entry corresponding to an accessed address to update a virtual-to-physical address conversion table. Although, the page table is generally managed by an OS (Operating System), a mechanism of managing the page table may be installed in the cache memory 12.

The cache memory 12 is, for example, an L2-cache 12. In the case where the processor 3 has the L1-cache 6 and the L2-cache 12 built therein, the cache memory 12 is a third-level cache memory (L3-cache).

The cache memory 12 has a cache controller 14, an error correction controller 15, a tag part 16, a data cache part 17, and a redundant circuitry 18. At least part of the cache memory 12 is configured with a non-volatile memory. In the present embodiment, an MRAM is used as the non-volatile memory. The MRAM in the present embodiment writes data in a spin-injection magnetization reversal mode, for example. In the spin-injection magnetization reversal mode, each memory cell has a magnetic tunnel junction (MTJ) device. The MTJ device has a layered structure of a magnetization layer and an insulation film. In more specifically, the MTJ device has a layered structure of a magnetization fixed layer generally with a fixed magnetization direction, an insulation film, and a storage layer with a magnetization direction changeable in a one-axis direction. When the storage layer and the fixed layer are magnetized in the same magnetization direction, this means that, for example, "0" is stored. When the storage layer and the fixed layer are magnetized in the opposite magnetization directions, this means that, for example, "1" is stored. The magnetization direction is changeable depending on a current direction.

In the cache memory 12, at least the data cache part 17 is configured with a non-volatile memory. The tag part 16 in the cache memory 12 may be configured with a volatile memory such as an SRAM or configured with a non-volatile memory.

The cache controller 14 has an access controller 19 that controls access to the cache memory 12. The detail of the access controller 19 will be explained later.

The error correction controller 15 detects whether there is an error in data read from the data cache part 17 to perform error correction if there is a correctable error.

The data cache part 17 stores cache line data that is accessible per cache line of a predetermined number of bits (for example, 512 bits). The tag part 16 stores address information of each cache line data.

If any cache line data stored in the data cache part 17 has an error of bits, the number of which is uncorrectable by the error correction controller 15, the redundant circuitry 18 changes a destination to store to a redundant line per cache line. The redundant circuitry 18 is provided with a plurality of redundant lines by the number of cache lines.

In addition, the memory system 1 of FIG. 1 is provided with an error information storage 20. Based on an error rate in the case where data of a predetermined number or more are written in the data cache part 17 and then the written data are read therefrom, the error information storage 20 stores information on whether there is an error in the written data, on whether there is an error in the written data, which is correctable by the error correction controller 15, and on whether there is an error in the written data, which is uncorrectable by the error correction controller 15.

Figure 2:
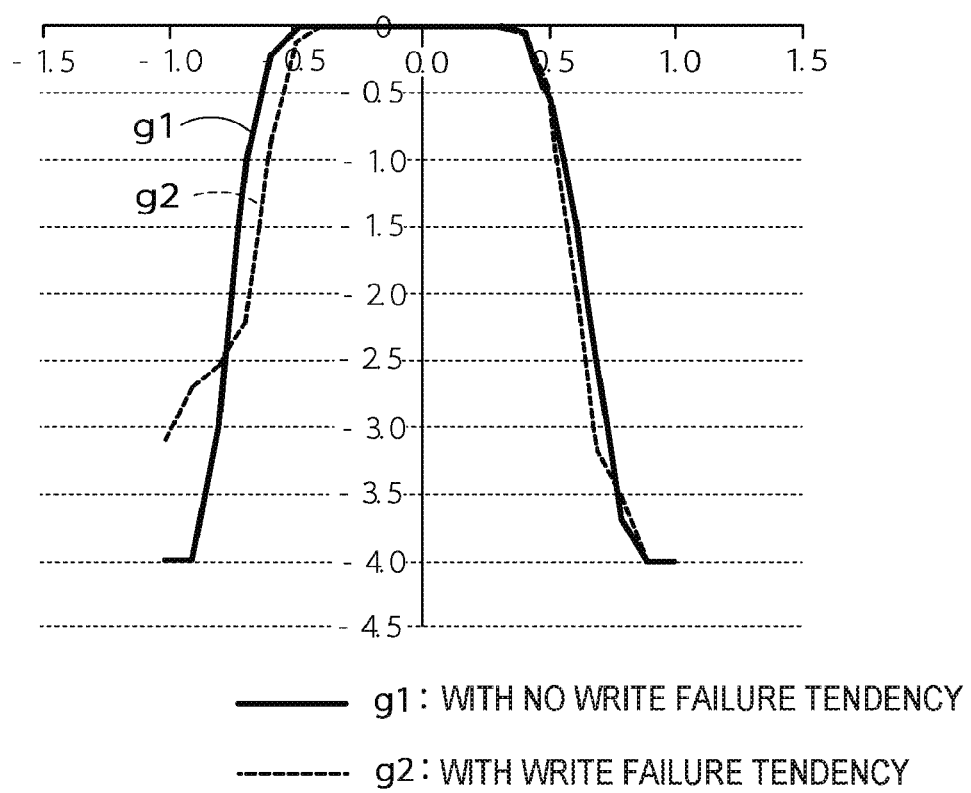
FIG. 2 is a graph showing an error rate in a data cache part in the case where there are some write failures and there are no write failures.

FIG. 2 is a graph showing an error rate in the data cache part 17 in the case where there are some write failures and there are no write failures. The abscissa in FIG. 2 represents a relative value of a write voltage. Plotted on the right side of "0" on the abscissa are relative values of voltages to rewrite data "0" with "1". Plotted on the left side of "0" on the abscissa are relative values of voltages to rewrite data "1" with "0". The ordinate in FIG. 2 represents an error occurrence rate in the data cache part 17, indicating numbers to the power of 10. In FIG. 2, a graph g1 represents no tendency of write failure whereas a graph g2 represents a tendency of write failure. As understood by comparing the graphs g1 and g2, there is a remarkable difference in error rate between the cases where there is a write failure and there is no write failure, when data write is performed by about $10^3=1000$ times. In view of this tendency, as a first screening method, data write is performed to a cache line by about 1000 times to inspect the error occurrence rate.

Then, the error information storage 20, in an initial screening before shipping non-volatile memories to be used as at least the data cache part 17, performs data write to the data cache part 17 by a specific number of times (for example, 1000 times) or more to detect an error rate, and based on the detected error rate, stores information for determining whether the data cache part 17 is in a normal condition, that is, there is no error, and whether there is an error which is correctable or uncorrectable.

Figures 3, 4A, 4B:
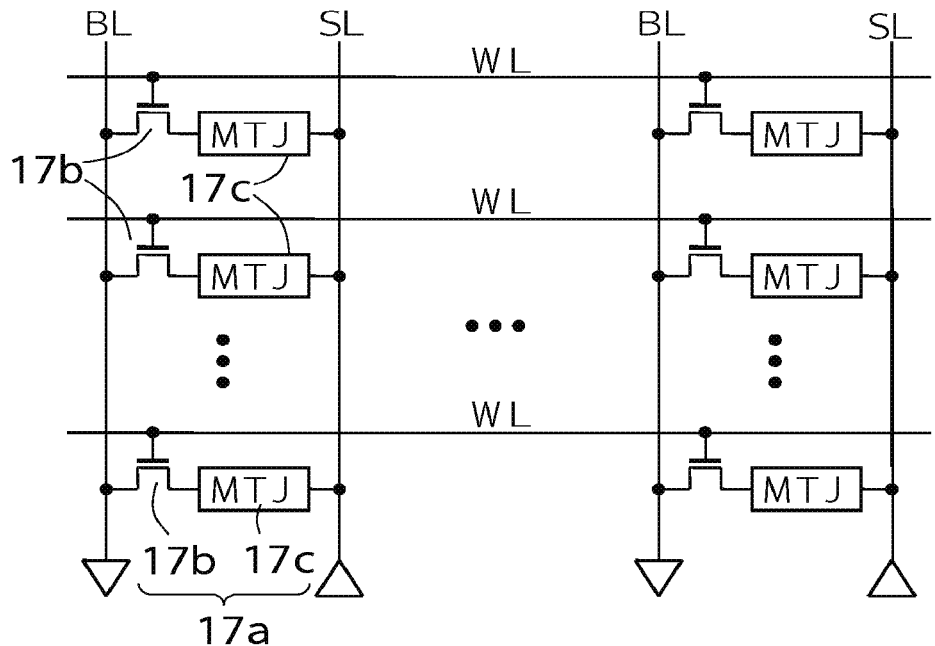
FIG. 3 is a circuit diagram schematically showing the internal configuration of a data cache part in a cache memory.
FIG. 4A is an illustration showing a first example of the data structure of an error information storage.
FIG. 4B is an illustration showing a second example of the data structure of the error information storage.

FIG. 3 is a circuit diagram schematically showing the internal configuration of the data cache part 17 in the cache memory 12. In the example of FIG. 3, 512 MRAM cells 17a are arranged in a direction of word lines WL. Each MRAM cell 17a has a transistor 17b and an MTJ device 17c. Gates of 512 transistors 17b arranged in the direction of word lines WL are connected to a common word line WL. A drain of each transistor 17b is connected to the associated bit line BL. A source of the transistor 17b is connected to one terminal of the MTJ device 17c. To the other terminal of the MTJ device 17c, the associated source line SL is connected.

The initial screening of the non-volatile memory performs, two times, a process of writing data to each cache line and of reading the written data to detect an error rate. In this way, for each cache line, data write is performed by 512×2=1024 times to initially detect bits having a tendency of write failure as shown in FIG. 2.

FIG. 3 shows an example of the configuration in which one memory cell 17a is disposed between one bit line BL and one source line SL. However, the arrangement in which a pair of memory cells 17a is disposed between a pair of bit lines BL can also be considered. In this case, even if an error occurs in a manner that the resistance values of a pair of MTJ devices in a pair of memory cells are both low or high, by comparing the resistance value of each MTJ device with that of a reference resistor in a reference cell, it is correctly detected that, at which MTJ device, an error occurs.

FIG. 4A is an illustration showing a first example of the data structure of the error information storage 20. In FIG. 4A, the error information storage 20 has the stuck flag information per cache line. The stuck flag information is set to, for example, "0" when there is no error in the associated cache line, "1" when there is a correctable bit error, and "2" when there is an uncorrectable bit error. When the stuck flag information is set to "2", it indicates that the associated cache line is replaced with a redundant line in the redundant circuitry 18. Accordingly, the stuck flag information in FIG. 4A includes information on a detection result of an error rate due to data write performed by a predetermined number of times or more in the initial screening.

The stuck flag information can include any values of any factors, and thus a variety of modifications are considered. For example, if a cache line data includes an error correctable by the error correction controller 15, the value of the stuck flag information may be changed depending on how many bits of error the cache line data includes.

FIG. 4B is an illustration showing a second example of the data structure of the error information storage 20. FIG. 4B shows an example in which, if there are error bits up to two bits in a cache line, the error correction controller 15 can correct the error. The stuck flag information in FIG. 4B is set to "0" when there is no error in the associated cache line, "1" when there is one correctable error bit, "2" when there are two correctable error bits, and "3" when there are three or more uncorrectable error bits.

In the case of FIG. 4B, by checking the stuck flag information only, whether an error in the associated cache line is correctable and the number of error bits included in the associated cache line can be determined. Therefore, by means of the value of the stuck flag information, a write condition depending on the number of error bits is selectable.

Figure 5:
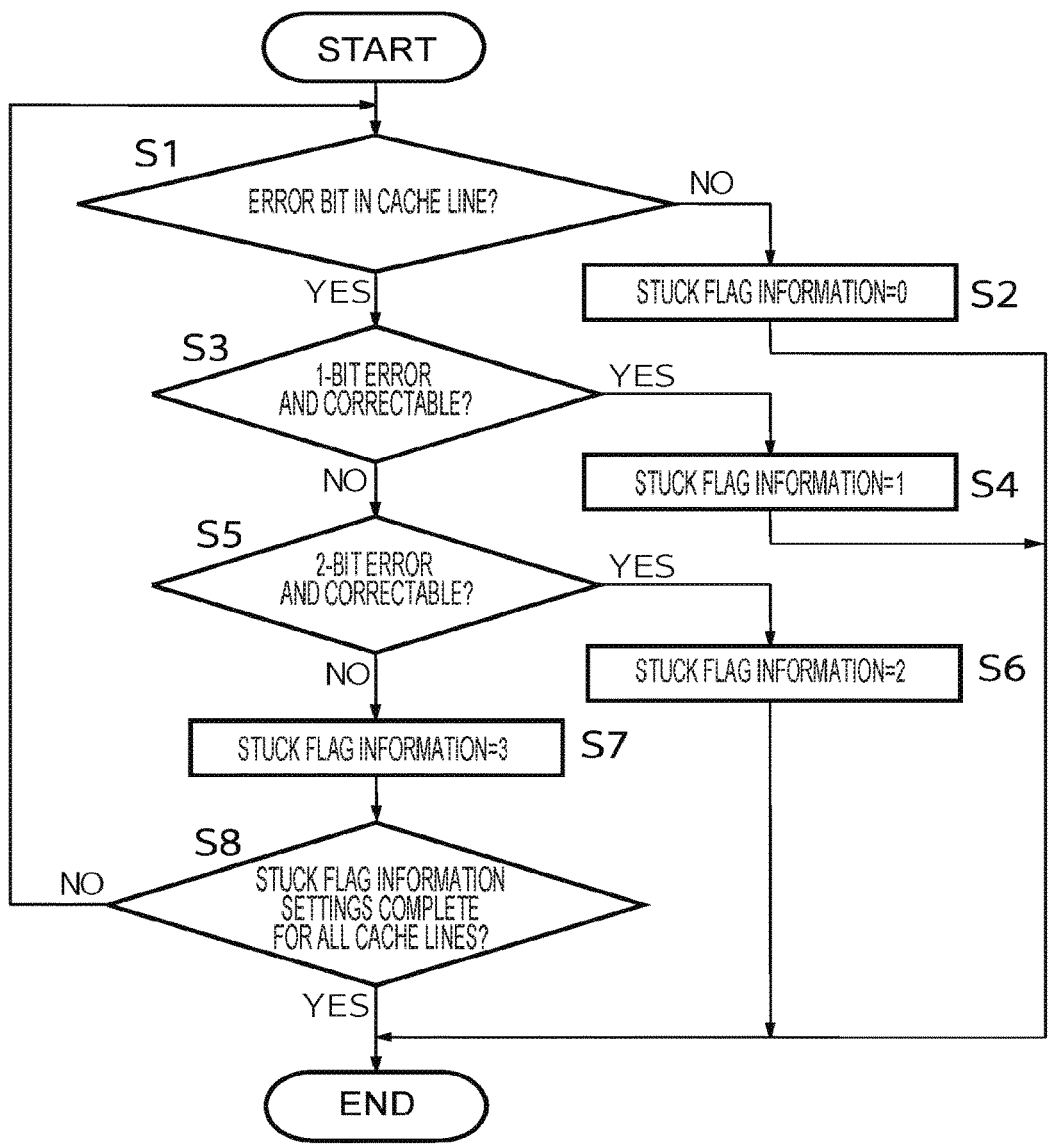
FIG. 5 is a flowchart showing an example of an initial screening process to be performed before shipping non-volatile memories.

FIG. 5 is a flowchart showing an example of an initial screening process to be performed before shipping non-volatile memories. The initial screening process is performed using a semiconductor inspection apparatus not shown. Hereinafter, an explanation will be made for initial screening of a non-volatile memory to be used as the data cache part 17. The flowchart shows an example in which the stuck flag information of FIG. 4B has been stored in the error information storage 20.

First of all, as described above, writing data and reading the written data are performed two times per cache line of the data cache part 17 to inspect whether there is an error bit in each cache line (step S1). As a result, if it is determined that there is no error bit (NO in step S1), the stuck flag information is set to 0 (step S2).

If YES in step S1, it is determined whether there is one error bit in the cache line and whether it is correctable by the error correction controller 15 (step S3). If YES in step S3, the stuck flag information is set to 1 (step S4).

If NO in step S3, it is determined whether there are two error bits in the cache line and whether they are correctable by the error correction controller 15 (step S5). If YES in step S4, the stuck flag information is set to 2 (step S6).

If NO in step S5, it is determined that there are three or more error bits in the cache line and they are uncorrectable by the error correction controller 15, so that the stuck flag information is set to 3 (step S7).

Subsequently, it is determined whether stuck flag information settings have been performed for all cache lines in the data cache part 17 (step S8). If there are cache lines for which the settings have not been performed yet, step S1 and the following steps are repeated.

A non-volatile memory for which the initial screening of FIG. 5 has been performed is built in a user apparatus before shipped, and, to the non-volatile memory, regular data write and read are performed. For a non-volatile memory configured with an MRAM, data write reliability is changed very much when a write condition is changed. The write condition is, for example, a condition that includes at least a write voltage, a write pulse width, a write current, write times, temperature, and magnetic fields, in writing data to the data cache part 17. The write reliability of the non-volatile memory configured with the MRAM is raised as the write voltage is raised, the write pulse width is longer, the write current is larger, the write times are larger, and the magnetic fields show a higher assisting function.

It is desirable that the write condition in writing data in the non-volatile memory in the initial screening is specified with a higher write reliability than the write condition in writing data in regular data writing after shipping. With this write condition, it is achieved to lower the frequency of write error occurrence in the initial screening than the frequency of write error occurrence in regular data writing, so that a rough write error check can be performed in the initial screening. Therefore, it is achieved to reduce the number of cache lines to be replaced with redundant lines in the initial screening.

Figure 6:
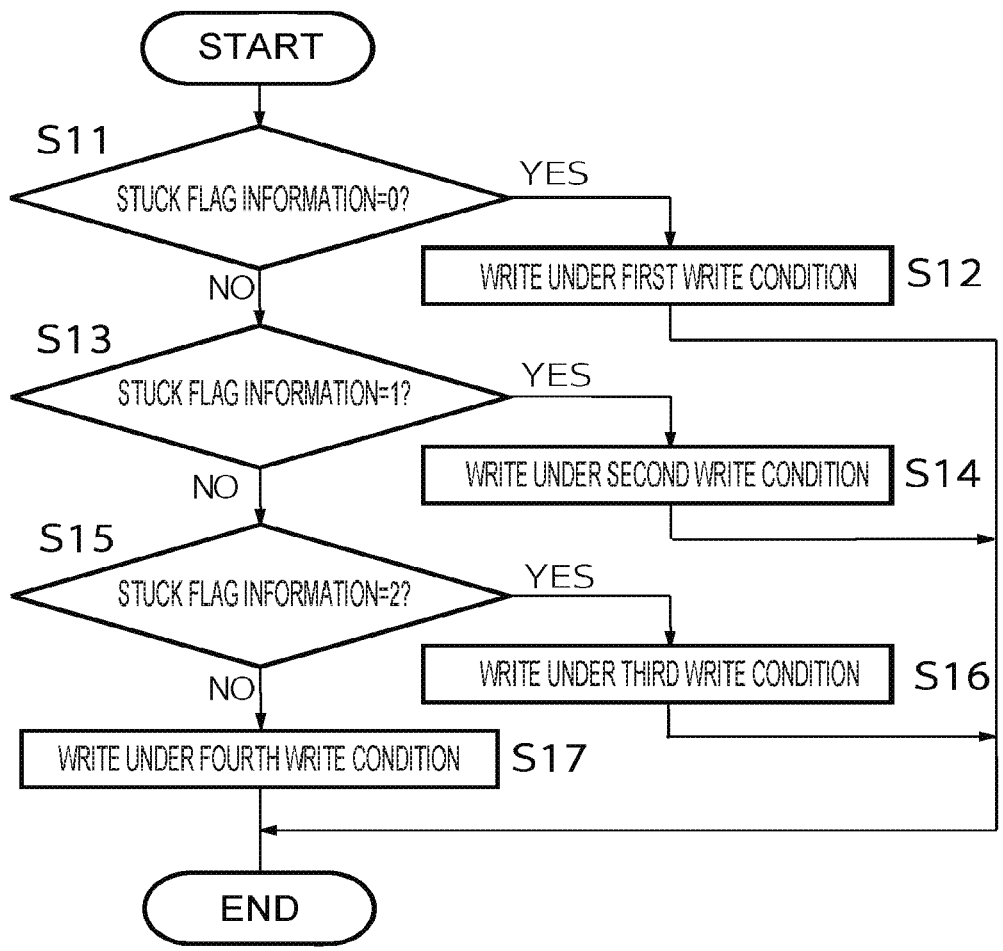
FIG. 6 is a flowchart showing a write process to be performed by a cache controller to a non-volatile memory.

When the non-volatile memory for which the initial screening of FIG. 5 has been performed is shipped and built in the processor system 2 of FIG. 1, the cache controller 14 performs a regular write process in response to a write request by the processor 3. FIG. 6 is a flowchart showing a write process to be performed by the cache controller 14 to the non-volatile memory.

First of all, it is determined whether the stuck flag information is 0 or not (step S11). If the stuck flag information is 0, a first write condition is selected to perform writing to the data cache part 17 (step S12). If NO in step S11, it is determined whether the stuck flag information is 1 or not (step S13). If the stuck flag information is 1, a second write condition is selected to perform writing to the data cache part 17 (step S14). The second write condition is higher than the first write condition in write reliability. In more practically, in the second write condition, at least one of the following settings is performed, which are setting the write voltage to be higher, setting the write pulse width to be longer, setting the write current to be larger, setting the number of write times to be larger, setting the temperature to be higher, and setting the assisting function of magnetic fields to be higher, than that of the first write condition.

If NO in step S13, it is determined that the stuck flag information is 2 or not (step S15). If the stuck flag information is 2, a third write condition is selected to perform writing to the data cache part 17 (step S16). The third write condition is higher than the second write condition in write reliability.

If NO in step S15, it is determined whether the stuck flag information is 3 to select a fourth write condition for performing writing to the data cache part 17 (step S17). When the stuck flag information is 3, since a cache line having an error is replaced with a redundant line, the fourth write condition may be at almost the same level as the first write condition.

As shown in FIG. 5, the cache controller 14 selects a write condition requiring a higher write reliability as the number of bits, for which error correction is to be performed by the error correction controller 15, increases and performs data write. Therefore, an error bit can be accurately corrected to reduce the probability in which error data is written in the data cache part 17.

In FIG. 1, the error information storage 20 is built in the cache memory 12. However, the error information storage 20 may be provided outside the cache memory 12. For example, the error information storage 20 may be built in the main memory 13 or may be provided outside the cache memory 12 and the main memory 13. Moreover, when the error information storage 20 is built in the cache memory 12, the error information storage 20 may be built in the tag part 16 or the data cache part 17.

As described above, in the first embodiment, the initial screening is performed before shipping the non-volatile memory configured with the MRAM to store the stuck flag information on the error rate of the non-volatile memory, in the error information storage 20. Therefore, in regular writing after shipping the non-volatile memory, based on the stuck flag information, an appropriate write condition can be selected for data write. Therefore, there is no possibility of performing replacement with the redundant circuitry 18 more than needed and of writing uncorrectable error data in the non-volatile memory.

Second Embodiment

In the second embodiment, the number of error times in reading from and writing to a shipped non-volatile memory is counted and access control is performed to the non-volatile memory in accordance with the counted number.

A memory system 1 according to the second embodiment has the same block configuration as that of FIG. 1. However, the data structure of the error information storage 20 in the second embodiment is different from that of the first embodiment.

Figures 7, 8:
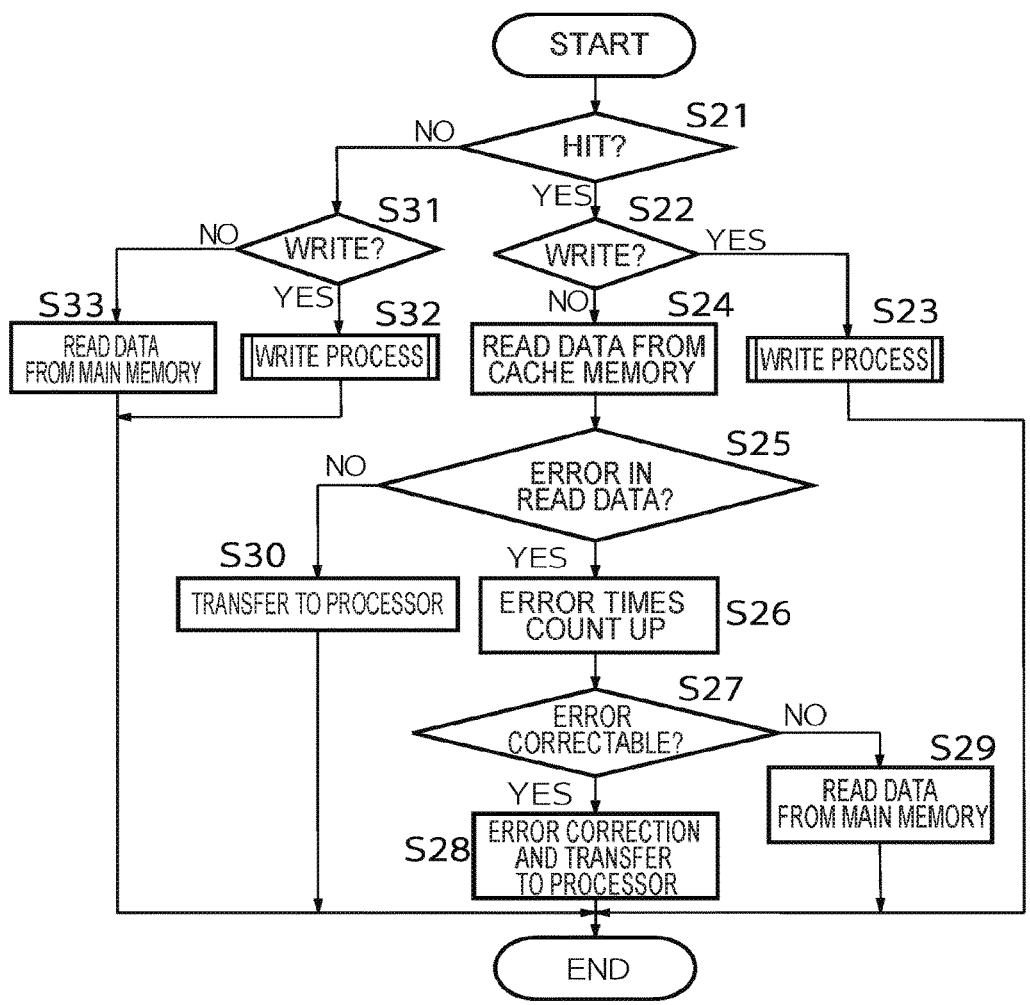
FIG. 7 is an illustration showing the data structure of an error information storage according to a second embodiment.
FIG. 8 is a flowchart of a process to be performed by a cache controller according to the second embodiment.

FIG. 7 is an illustration showing the data structure of the error information storage 20 according to the second embodiment. The error information storage 20 of FIG. 7 stores, in addition to the stuck flag information of FIG. 4A or FIG. 4B, the number of error times in reading from and writing to a shipped non-volatile memory, per cache line. The number of error times is counted by, as shown in a dot-line frame of FIG. 1, an error times counter (error times counting unit) 21 in the cache memory 12. In this way, the error information storage 20 of FIG. 7 stores the stuck flag information on the error rate detected in the initial screening before shipping the non-volatile memory and information on the number of error times in reading from and writing to the shipped non-volatile memory.

FIG. 8 is a flowchart of a process to be performed by the cache controller 14 according to the second embodiment. First of all, it is determined whether an address, at which the processor 3 has performed an access request to the memory system 1, hits an address in the tag part 16 (step S21). If there is a hit, it is determined whether the access request is writing (step S22). If it is writing, a write process shown in FIG. 9 in detail is performed (step S23).

Figure 9:
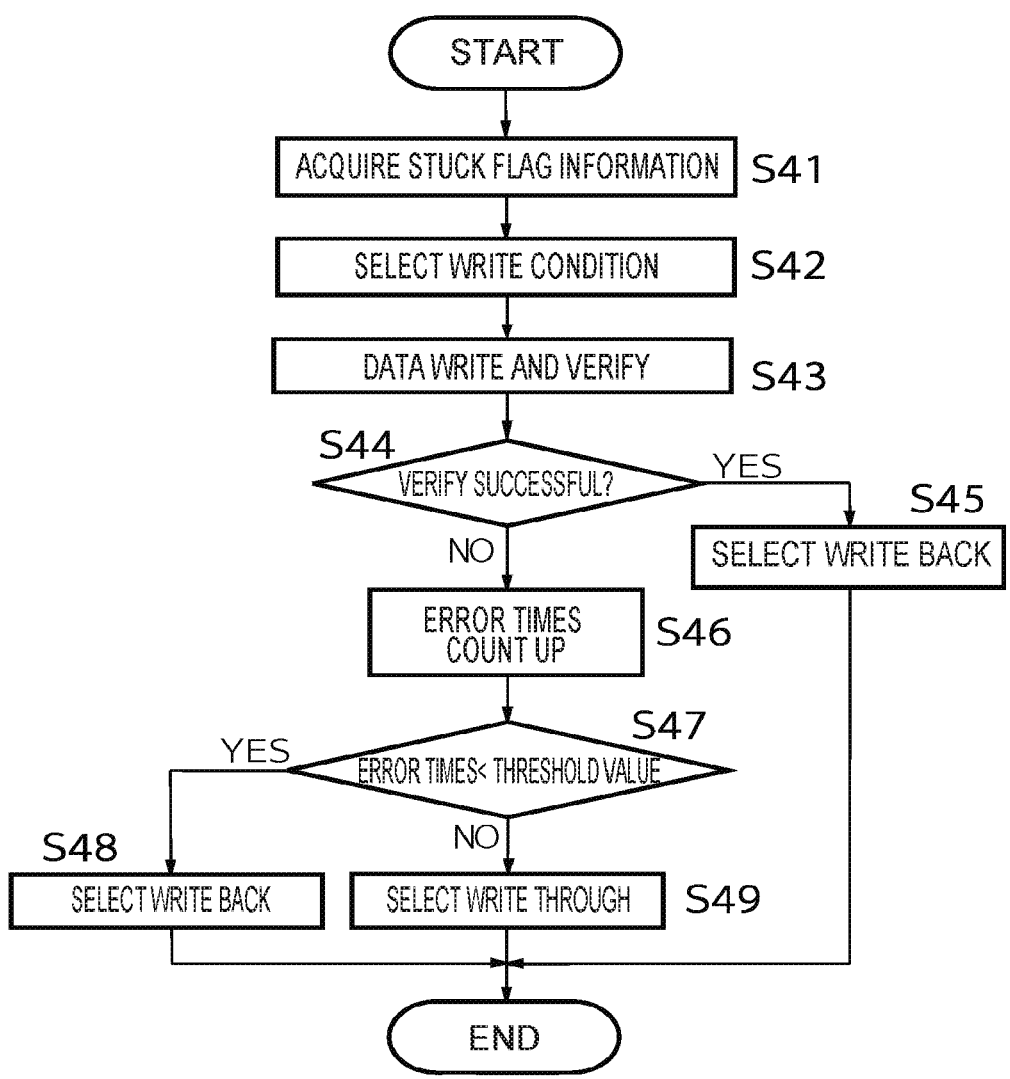
FIG. 9 is a detailed flowchart of a write process.

In the write process, as shown in FIG. 9, the stuck flag information on a cache line that corresponds to the address at which the write request has been made, is acquired from the error information storage 20 (step S41) and a write condition, which corresponds to the acquired stuck flag information, is selected in the process of FIG. 6 (step S42). The write condition may be set in view of the value of the number of error times stored in the error information storage 20. In other words, the write condition may be set in view of, not only the stuck flag information in the initial screening performed before shipping the non-volatile memory, but also of the number of error times in reading and writing after shipping the non-volatile memory. For example, as the number of error times is larger, it may be performed to set the write voltage to be higher, the write pulse width to be longer, the write current to be larger, the number of write times to be larger, and the temperature to be higher, and to perform assisting by means of magnetic fields.

Subsequently, under the write condition selected in step S42, writing to the data cache part 17 is performed to verify the written data (step S43). Subsequently, it is determined whether the verification is successful (step S44). If successful, a write back mode is selected (step S45). The write back mode is to write-back data written in the cache memory 12 to the main memory 13 at a predetermined timing thereafter.

If it is determined in step S44 that the verification is successful, the error times counter 21 for measuring the number of error times is counted up (step S46). Subsequently, it is determined whether the number of error times counted by the error times counter 21 is smaller than a threshold value (step S47). If it is determined that the number of error times is smaller than the threshold value, the process proceeds to step S48 to select the write back mode. If it is determined that the number of error times is equal to or larger than the threshold value, a write through mode is selected (step S49). The write through mode is, in parallel with writing data in the cache memory 12, to write the same data in the main memory 13.

If it is determined as reading not writing in step S22, in accordance with the access request form the processor 3, data is read from the cache memory 12 (step S24). Subsequently, it is determined by the error correction controller 15 whether there is an error in the read data (step S25). If it is determined that there is an error, the count value of the error times counter 21 is counted up (step S26) and then it is determined whether the error is correctable by the error correction controller 15 (step S27). If it is determined that the error is correctable, the error is corrected by the error correction controller 15 and then the error-corrected data is transferred to the processor 3 (step S28). If it is determined in step S27 that the error is uncorrectable, data is read from the main memory 13 (step S29). If it is determined in step S25 that there is no error, the read data is transferred to the processor 3 (step S30).

In parallel with the process in step S29, it may be performed to invalid the cache line determined as uncorrectable and then to replace the cache line with a redundant line in the redundant circuitry 18.

If it is determined in step S21 that there is no hit, it is determined whether to perform writing (step S31). In the case of writing, the write process shown in FIG. 9 is performed (step S32). In the case of reading, data of an address at which the processor 3 has performed a read request is read from the main memory 13 and is transferred to the processor 3 (step S33).

As described, in the second embodiment, the write condition and the write mode to the cache memory 12 are selected in view of, not only the initial screening before shipping the non-volatile memory, but also of the number of error times in reading and writing after shipping the non-volatile memory. Therefore, the reliability of data to be written in the non-volatile memory can be improved.

Third Embodiment

In the third embodiment, the data amount of an error correction code is varied based on information stored in the error information storage 20.

Figure 10:
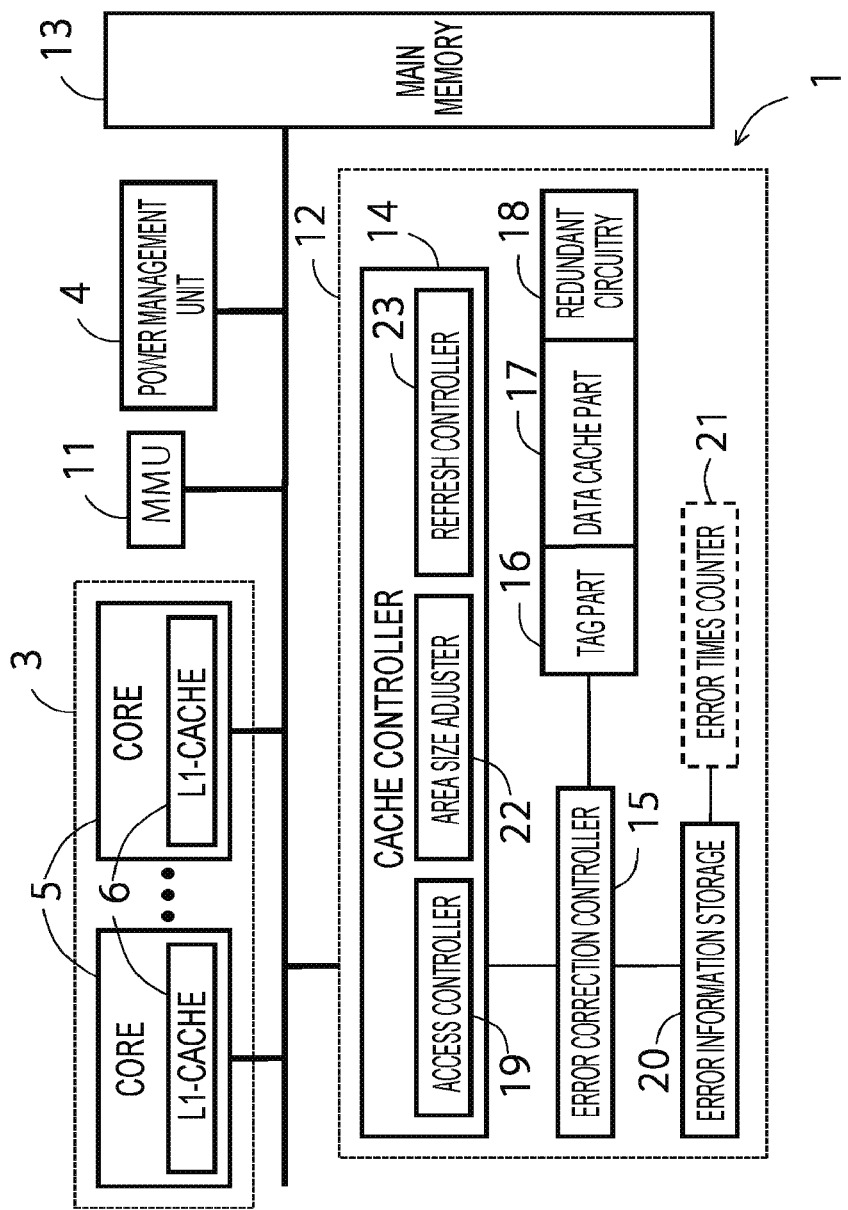
FIG. 10 is a block diagram schematically showing the configuration of a processor system provided with a memory system according to a third embodiment.

FIG. 10 is a block diagram schematically showing the configuration of a processor system 2 provided with a memory system 1 according to the third embodiment. The memory system 1 of FIG. 10 is provided with a cache controller 14 having a different internal configuration from that of FIG. 1. Moreover, a data cache part 17 in the memory system 1 of FIG. 10 has a first area 17d for storing data to be read and written by the processor 3, for example, per 512-bit cache line and a second area 17e for storing an error correction code to be used for correcting an error of data in the first area 17d.

The cache controller 14 of FIG. 10 has an area size adjuster 22 and a refresh controller 23. The area size adjuster 22 adjusts the size of the second area 17e in the non-volatile memory based on the information stored in the second area 17e. The refresh controller 23 periodically reads the data written in the first area 17d in the data cache part 17 and supplies the read data to the error correction controller 15. Having the refresh controller 23 provided to periodically read the data written in the data cache part 17 for rewriting, a problem does not occur in such a manner that the logic of data in the non-volatile memory is inverted unintentionally.

The error correction controller 15 inspects whether there is an error in the data read by the refresh controller 23 and corrects the error if there is the error.

The memory system 1 of FIG. 10 has an error information storage 20 having the same data structure as that shown in FIG. 7. The error information storage 20 is, for example, built in the cache controller 14. However, there is no particular limitation on the location of the error information storage 20.

Figure 11:
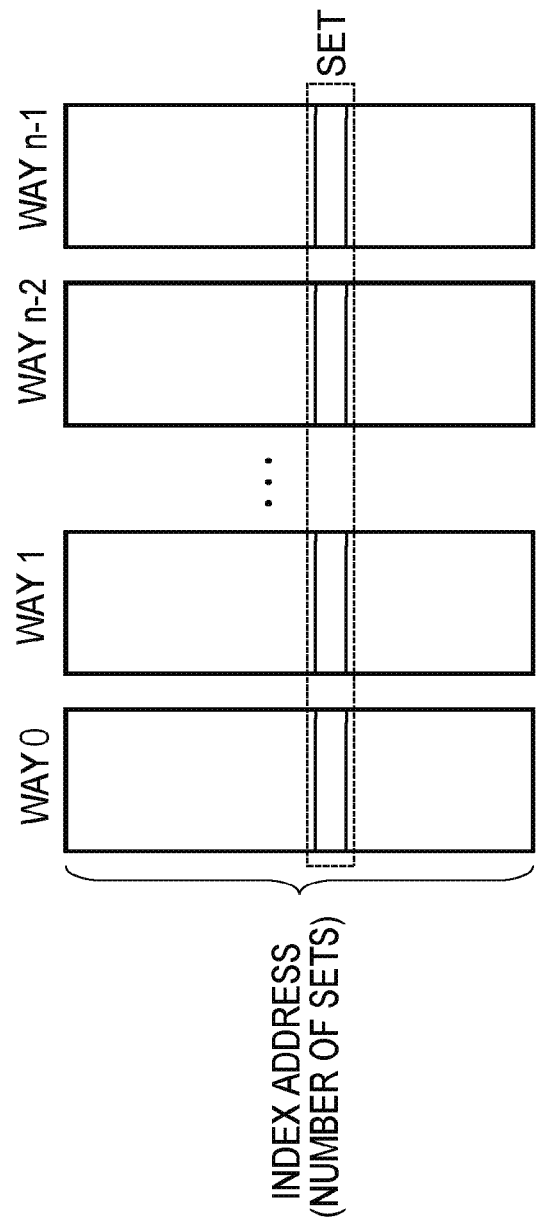
FIG. 11 is an illustration showing the configuration of a set associative cache memory.

The cache memory 12 according to the present embodiment has a set associative configuration. FIG. 11 is an illustration showing the configuration of a set associative cache memory 12. As shown in FIG. 11, the cache memory 12 according to the present embodiment is divided into a plurality of ways. Each way has a data bit length by the number of cache lines. A specific set of the plurality of ways is selected by using an index address that is a part of an address at which there is an access request from the processor 3. The specific set includes cache lines by the number of ways, each cache line having, for example, 512 bits.

In the present embodiment, any number of ways among cache lines corresponding to multiple ways selected by an index address, can be used as the second area 17e for storing the error correction code. The number of ways to be used as the second area 17e may be varied per index address, that is, per set. As described above, according to the present embodiment, the sizes of the first area 17d and the second area 17e can be adjusted per set.

Figure 12:
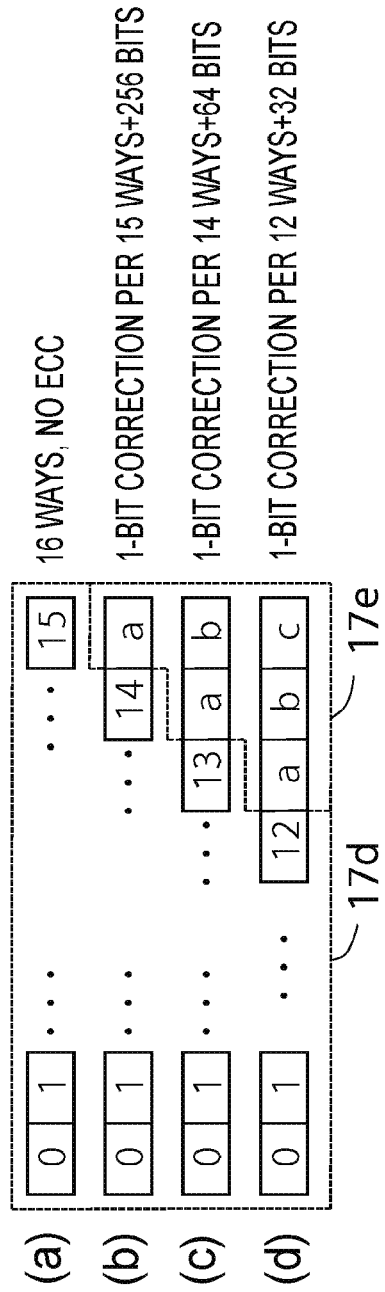
FIGS. 12(a) to 12(d) are illustrations showing a use mode of a first area and a second area.

FIG. 12(a) shows an example in which all of 16 ways are used for the first area 17d. FIG. 12(b) shows an example in which 15 ways among the 16 ways are used for the first area 17d and the remaining one way is used for the second area 17e. FIG. 12(c) shows an example in which 14 ways among the 16 ways are used for the first area 17d and the remaining two ways are used for the second area 17e. FIG. 12(d) shows an example in which 13 ways among the 16 ways are used for the first area 17d and the remaining three ways are used for the second area 17e.

In the case of FIG. 12(b), for example, 1-bit error correction is possible per 256 bits of data in the first area 17d. In other words, if one cache line (one way) has 512 bits, since one way is divided into a plurality of areas each having a half data bit width so that 1-bit error correction is possible per divided area (256 bits), 2-bit error correction is possible in one way.

In the case of FIG. 12(c), for example, 1-bit error correction is possible per 64 bits of data in the first area 17d. In this case, since one way is divided into four areas so that 1-bit error correction is possible per divided area (64 bits), 4-bit error correction is possible in one way.

In the case of FIG. 12(d), for example, 1-bit error correction is possible per 32 bits of data in the first area 17d. In this case, since one way is divided into eight areas so that 1-bit error correction is possible per divided area (32 bits), 8-bit error correction is possible in one way.

In the present embodiment, at the time of verification performed just after data writing in the cache memory 12 or of data reading, the number of error times detected by the error correction controller 15 is stored in the error information storage 20 and, based on the number of error times, the sizes (memory capacity) of the first area 17d and the second area 17e are adjusted per way for each set. In this way, for set with a large number of error times, by increasing the size of the second area 17e, a more number of errors can be corrected to prevent the decrease in reliability of the non-volatile memory.

Figure 13:
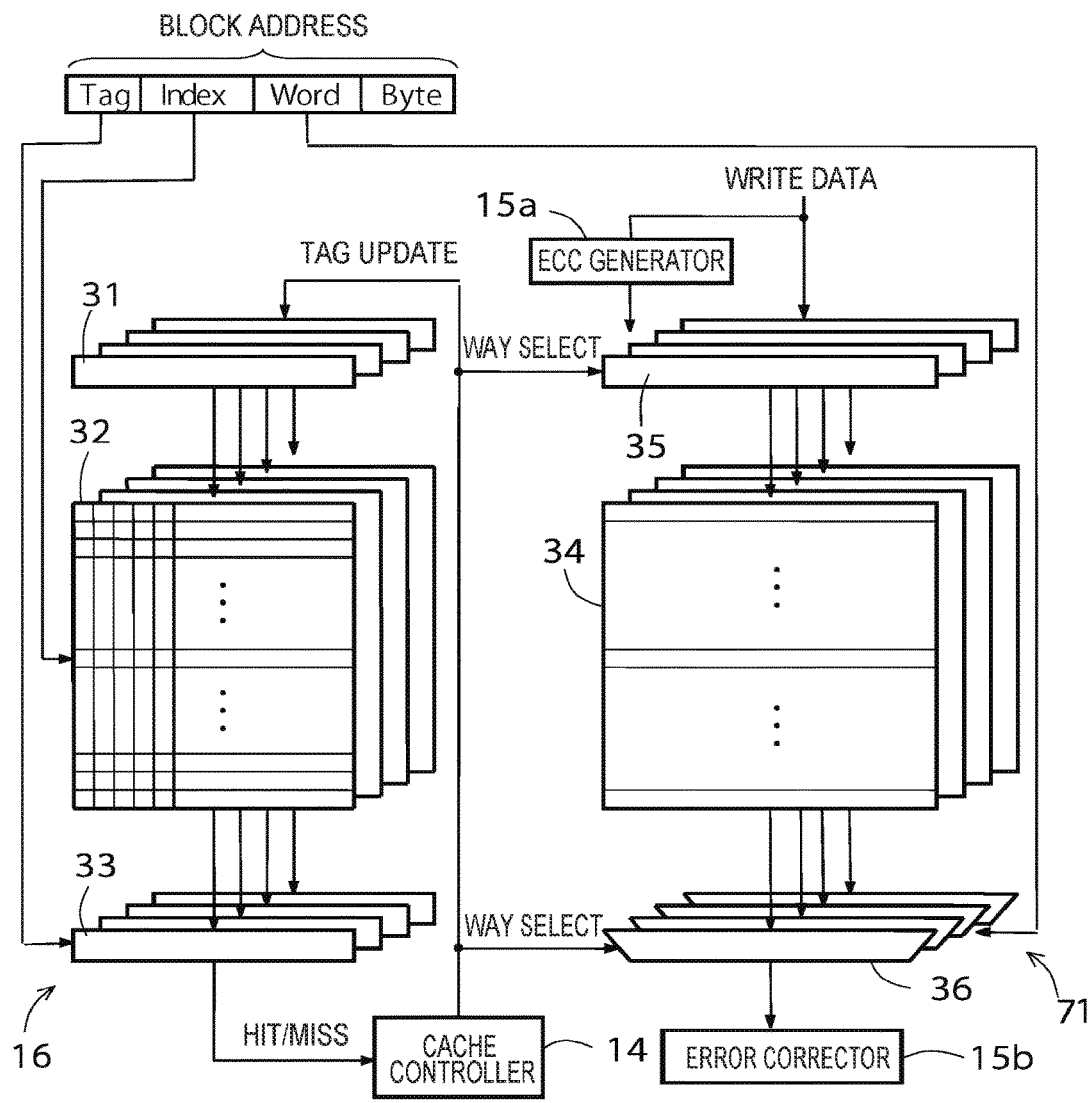
FIG. 13 is a block diagram showing the internal configuration of a cache memory more in detail.

FIG. 13 is a block diagram showing the internal configuration of the cache memory 12 more in detail. The tag part 16 has a tag address selector 31, a tag information storage 32, and a hit determiner 33. The tag address selector 31 selects a way to be read to supply address information to the selected way. The tag information storage 32 stores tag information corresponding to each data in the data cache part 17. The hit determiner 33 compares the tag information read from the tag information storage 32 with an index address in a block address at which there is an access request from the processor 3 to output a hit/miss determination signal.

The tag information storage 32 stores, in addition to address information of data in the first area 17d, information (ECC flag information, or first information) indicating whether the second area 17e is present and information (second information) for identifying a way to be used as the second area 17e.

The data cache part 17 has a data storage 34, a write unit 35, and a read unit 36. The data storage 34 is divided into a plurality of ways, to perform data write or read per way. The write unit 35 selects a way to be written in the data cache part 17 to supply data to be written in the selected way. The read unit 36 selects a way to be read from the data cache part 17 to supply data to be read from the selected way.

An ECC generator 15a and an error corrector 15b of FIG. 13 are built in the error correction controller 15 of FIG. 1. The ECC generator 15a generates an error correction code for data to be written in the data cache part 17. The error corrector 15b corrects an error of data read from the data cache part 17.

Figure 14:
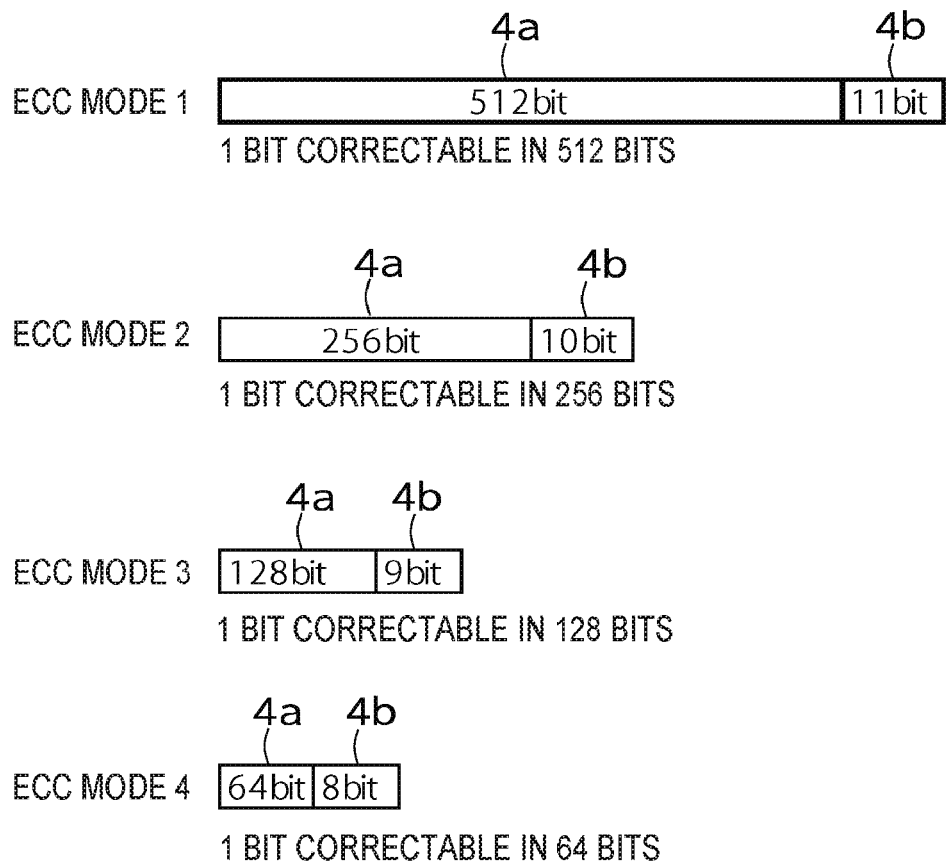
FIG. 14 is an illustration showing the relationship between the number of data bits and the number of correctable bits.

FIG. 14 is an illustration showing the relationship between the number of data bits and the number of correctable bits. FIG. 14 shows an example in which one way (cache line) has 512 bits. In the present embodiment, error correction performance is changeable, different error correction performances being specified as ECC modes 1 to 4.

The ECC mode 1 is a mode for correcting a 1-bit error in 512-bit data. In order to correct the 1-bit error in the 512-bit data, for example, an 11-bit error correction code is required. Therefore, in order to correct the 1-bit error for each of 15 ways, an error correction code of 11×15=165 bits is required to be stored in the second area 17e.

The ECC mode 2 is a mode for correcting a 1-bit error in 256-bit data. In order to correct the 1-bit error in the 256-bit data, for example, a 10-bit error correction code is required.

Therefore, 2-bit errors are correctable for the 512-bit data. In order to correct these errors, error correction codes of 10×2=20 bits are required. Therefore, 2-bit errors are correctable for the 512-bit data. In order to correct errors of up to two bits for each of the 15 ways in the first area 17a, error correction codes of 20×15=300 bits are required to be stored in the second area 17e.

The ECC mode 3 is a mode for correcting a 1-bit error in 128-bit data. In order to correct the 1-bit error in the 128-bit data, for example, a 9-bit error correction code is required. Therefore, 4-bit errors are correctable for the 512-bit data. In order to correct these errors, error correction codes of 9×4=36 bits are required. Therefore, if the first area 17a has 15 ways, in order to correct errors of up to four bits for each way, error correction codes of 36×15=540 bits are required to be stored in the second area 17e. If the second area 17e has one way, it can store 512-bit information in maximum. Therefore the second area 17e requires two ways as the second area 17e. In this case, the first area 17d has 14 ways, so that error correction codes of 36×14=504 bits are stored in the second area 17e.

The ECC mode 4 is a mode for correcting a 1-bit error in 64-bit data. In order to correct the 1-bit error in the 64-bit data, for example, an 8-bit error correction code is required. Therefore, 8-bit errors are correctable for the 512-bit data. In order to correct these errors, error correction codes of 8×8=64 bits are required. Therefore, if the first area 17a has 14 ways, error correction codes of 64×14=896 bits are required to be stored in the second area 17e.

As described above, depending on the error correction performance, the number of bits of a required error correction code varies, so that it is required to perform an adjustment to vary the sizes of the first area 17d and the second area 17e. This adjustment is performed by an area size adjuster 22 of FIG. 16.

Figure 15:
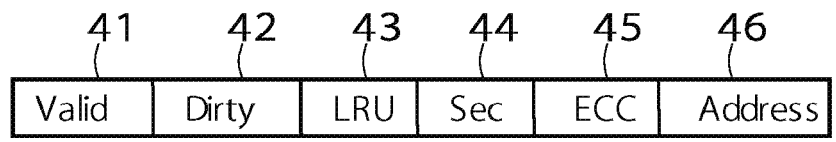
FIG. 15 is an illustration showing the details of tag information to be stored in a tag information storage in a tag part.

FIG. 15 is an illustration showing the details of the tag information to be stored in the tag information storage 32 (refer to FIG. 13) in the tag part 16. The tag information storage 32 stores the tag information per set. As shown in FIG. 15, the tag information includes Valid information 41, Dirty information 42, LRU information 43, Sec information 44, ECC flag information 45, and address information 46. The error information storage 20 may be built in the tag part 16.

The Valid information 41 indicates whether data in the associated first area 17d is valid or not. The Dirty information 42 indicates whether the data in the associated first area 17d is required to be written back to a lower-layer memory. The LRU information 43 indicates whether the data in the associated first area 17d is LRU (Least Recently Used) data. The Sec information 44 is security information on the data in the associated first area 17d. The ECC flag information 45 stores information that indicates whether the data in the associated first area 17d has, not only the first area 17d, but also the second area 17e. The ECC flag information 45 may include information (hereinafter, an ECC mode) for identifying an error correction mode that indicates error correction performance, and rotation information on the second area 17e. The ECC mode is, for example, to select any one of a plurality of modes including the four modes shown in FIG. 14. For example, if there are eight modes in total, three bits are required for the ECC mode. The rotation information is used for periodically shifting the second area 17e for storing the error correction code, in the non-volatile memory. In this way, the access frequency to the non-volatile memory can be made constant to raise write tolerance of the non-volatile memory. For example, If the cache memory 12 has 16 ways to use these ways as the second area 17e one by one, since there are 16 options, 4 bits are required to select any one of the 16 ways.

Therefore, the ECC flag information 45 requires, for example, three bits for the ECC mode and four bits for the rotation information, that is, at least seven bits. Based on the number of error times stored in the information storage 20, the area size adjuster 22 can adjust the sizes of the first area 17d and the second area 17e.

Figure 16:
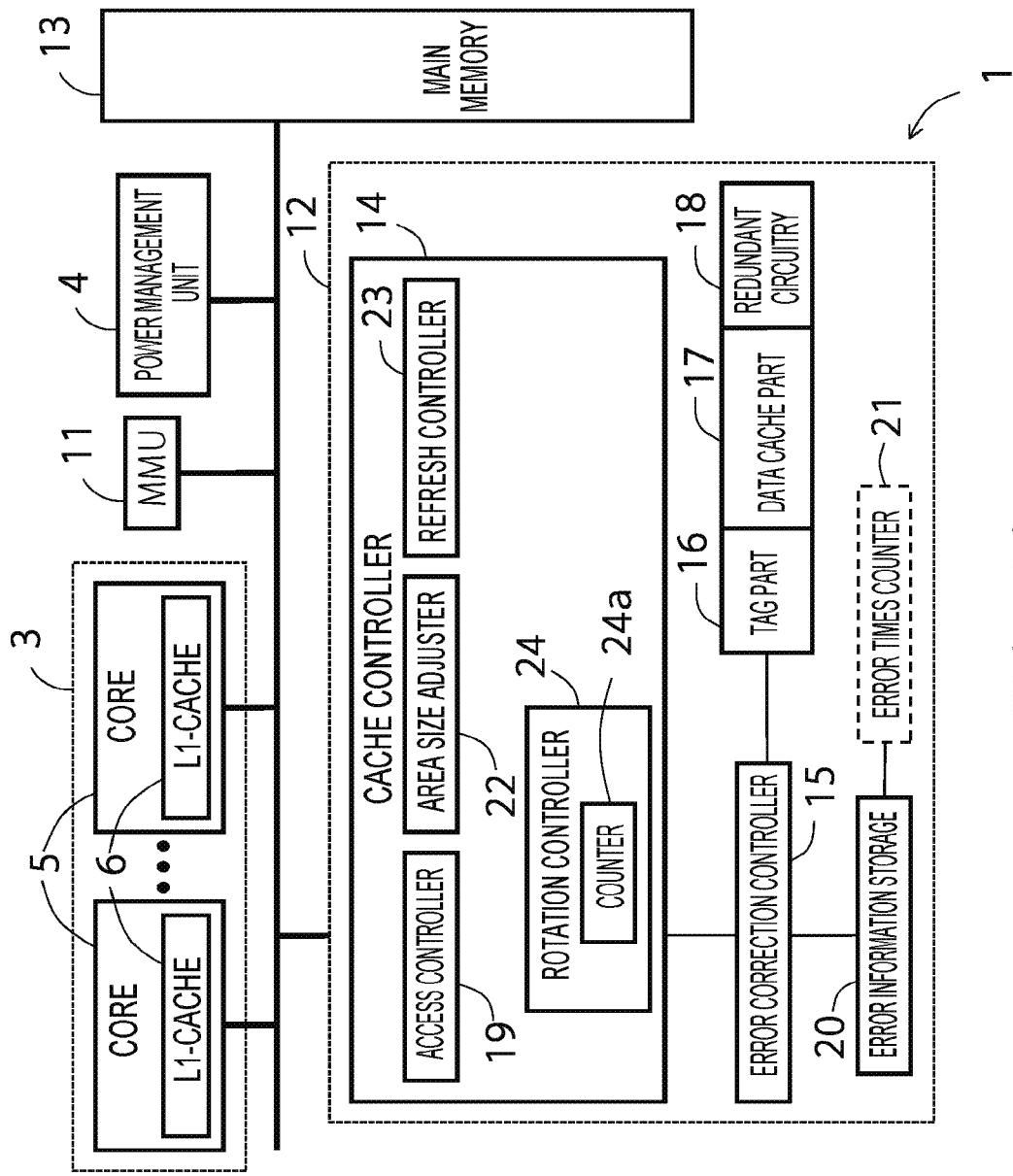
FIG. 16 is a block diagram showing the configuration of a cache memory having a rotation controller.

In order to perform rotation of the second area 17e, as shown in FIG. 16, it is desirable to provide a rotation controller 24 and a counter (access times measurer) 24a for rotation control. The rotation controller 24 shifts the location of the second area 17e to be allocated in the non-volatile memory if the number of error times stored in the information storage 20 exceeds a predetermined threshold value. The counter 24a measures the access times to the second area 17e. The rotation controller 24 shifts the second area 17e to another way if the access times measured by the counter 24a exceeds a predetermined threshold value.

Figure 17:
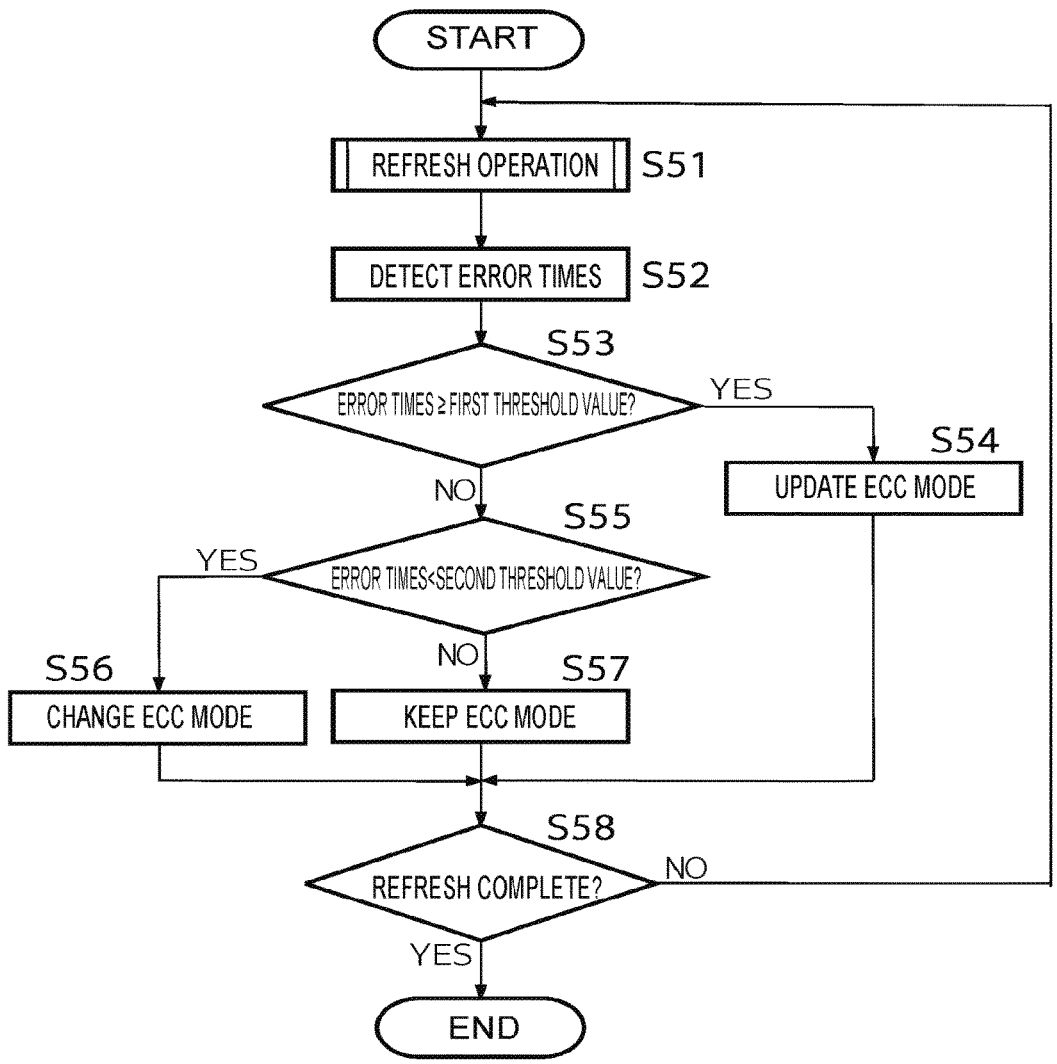
FIG. 17 is a flowchart showing a first example of the process of operation of a cache controller according to the third embodiment.
Figure 18:
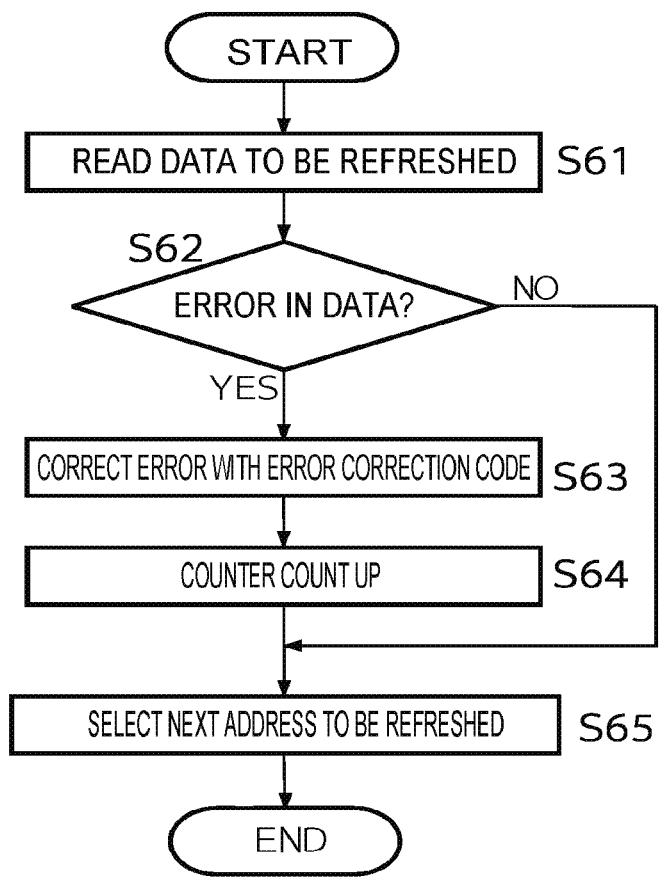
FIG. 18 is a flowchart showing a refresh operation in step S51 of FIG. 17.

FIG. 17 is a flowchart showing a first example of the process of operation of the cache controller 14 according to a third embodiment. First of all, a refresh operation is performed (step S51). FIG. 18 is a detailed flowchart of the refresh operation in FIG. 17. The operation in the flowchart of FIG. 18 is performed by a refresh controller 23. First of all, data to be refreshed is read (step S61). The data to be refreshed is data, for example, for which a predetermined period of time passes after the data has been written in the first area 17d of the non-volatile memory. This data is periodically refreshed when the predetermined period of time passes after the data has been written in the first area 17d.

Subsequently, the data read in step S61 is supplied to the error correction controller 15. The error correction controller 15 uses an error correction code for the data to be refreshed to detect whether the data has an error (step S62). If the error is detected, the error correction controller 15 uses the error correction code to perform error correction (step S63). If step S63 is complete, the error times counter 21 for measuring the number of error times is counted up (step S64).

If it is determined in step S62 that there is no error, or step S64 is complete, an address to be refreshed next is selected (step S65).

If step S65 of FIG. 18, that is, a refresh operation to data to be refreshed, is complete, a count value of the error times counter 21 is detected (step S52 in FIG. 17). Subsequently, the area size adjuster 22 determines whether the number of error times is equal to or larger than a first threshold value (step S53). If the number of error times is equal to or larger than the first threshold value, the area size adjuster 22 changes the ECC mode to enhance the error correction performance (step S54). In this case, the area size adjuster 22 varies the size of the second area 17e from a first size to a larger second size.

Subsequently, the area size adjuster 22 determines whether the number of error times is smaller than a second threshold value that is smaller than the first threshold value (step S55). If the number of error times is smaller than the second threshold value, the area size adjuster 22 changes the ECC mode to lower the error correction performance (step S56). If the number of error times is equal to or larger than the second threshold value, the ECC mode remains unchanged (step S57).

Subsequently, it is determined whether the refresh operation is complete for all of addresses to be refreshed (step S58). If there is an address to be refreshed for which the refresh operation is not complete yet, step S51 and the following step are repeated. If the refresh operation is complete for all of addresses to be refreshed, the process of FIG. 17 is complete.

Figure 19:
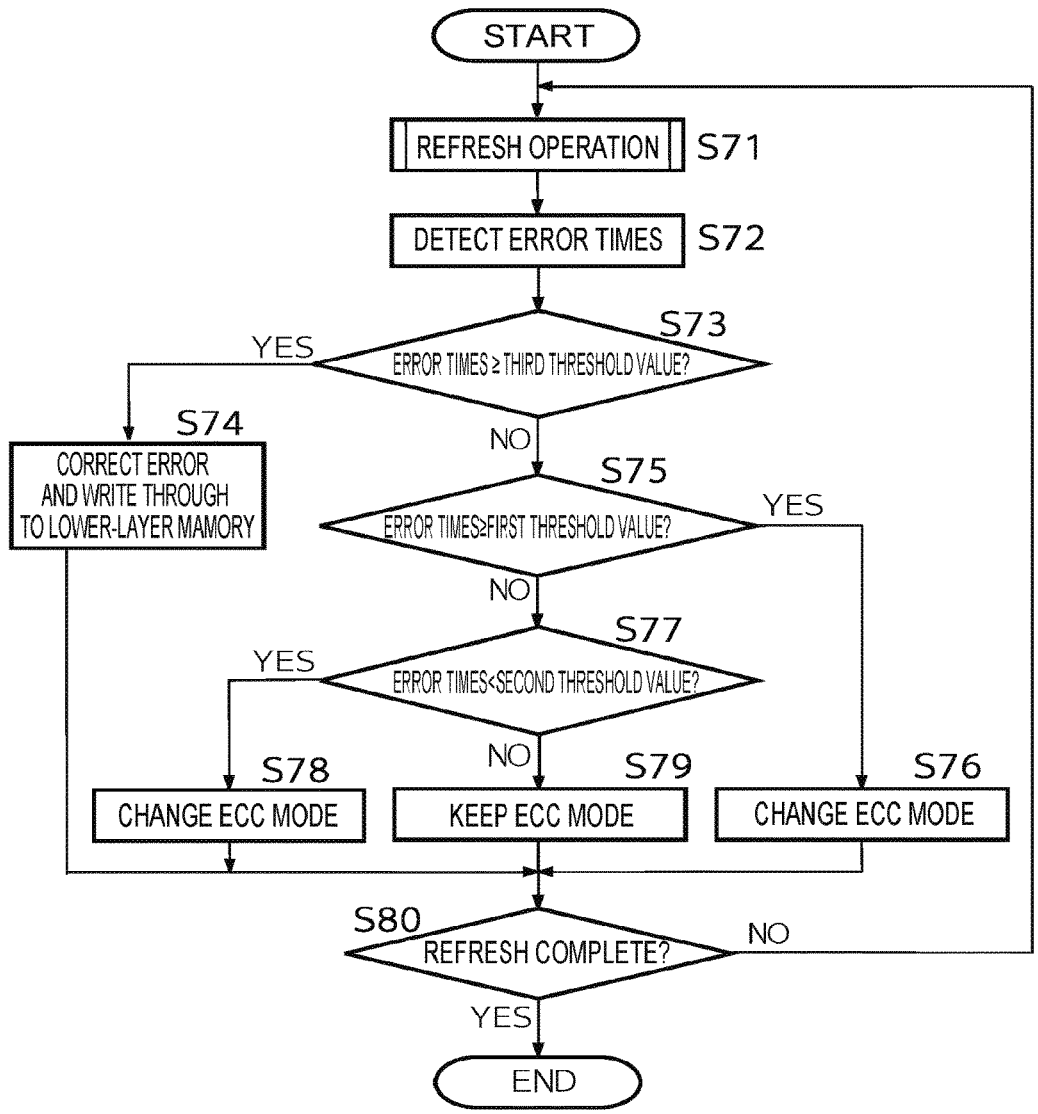
FIG. 19 is a flowchart showing a second example of the process of operation of a cache controller.

The operation of the cache controller 14 is not limited to that shown in FIG. 17. For example, the cache controller 14 may write data, which has been written in a set of a low write reliability, to a lower-layer memory in write through. FIG. 19 is a flowchart showing a second example of the process of operation of the cache controller 14. First of all, a refresh operation is performed (step S71) in the same manner as in FIG. 18. If the refresh operation to data to be refreshed is complete, subsequently, the number of error times is detected (step S72) to determine whether the number of error times is equal to or larger than a third threshold value that is larger than the first threshold value (step S73). If the number of error times is equal to or larger than the third threshold value, error correction is performed and the data is written in the lower-layer memory in write through (step S74). In this case, the ECC mode may be changed to improve the error correction performance.

If it is determined step S73 that the number of error times is smaller than the third threshold value, subsequently, it is determined whether the number of error times is equal to or larger than the first threshold value (step S75). Thereafter, the process in the same manner as steps S53 to S58 of FIG. 17 is performed (steps S75 to S80).

Figure 20:
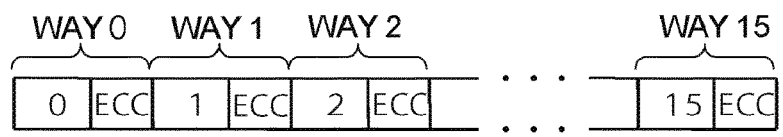
FIG. 20 is an illustration explaining size adjustments to the first area and the second area in a way.

The above-described embodiment has explained an example in which the sizes of the first area 17*d* and the second area 17*e* are adjusted per way for each set. However, as shown in FIG. 20, the sizes of the first area 17*d* and the second area 17*e* may be adjusted in each way. For example, if one way has 512 bits, a part of the 512 bits may be used for the first area 17*d*, and the remaining bits for the second area 17*e*.

As described as above, in the third embodiment, since, based on the number of error times stored in the error information storage 20, the size of the second area 17*e* to store the error correction code in the data cache part 17 is adjusted, the error correction codes can be increased if the number of error times of the data in the first area 17*d* is large. Therefore, the probability of accurately correcting the data in the first area 17*d* is increased. Accordingly, the non-volatile memory can be used with no practical problems even if the number of error times of the non-volatile memory is increased due to access times, environmental conditions such as aging degradation and temperature, etc.

Fourth Embodiment

In the above-described first to third embodiment, writing to and reading from the cache memory 12 configured with the non-volatile memory have been explained. If the main memory 13 is configured with the non-volatile memory, writing to the main memory 13 may be controlled based on the information stored in the error information storage 20.

Figure 21:
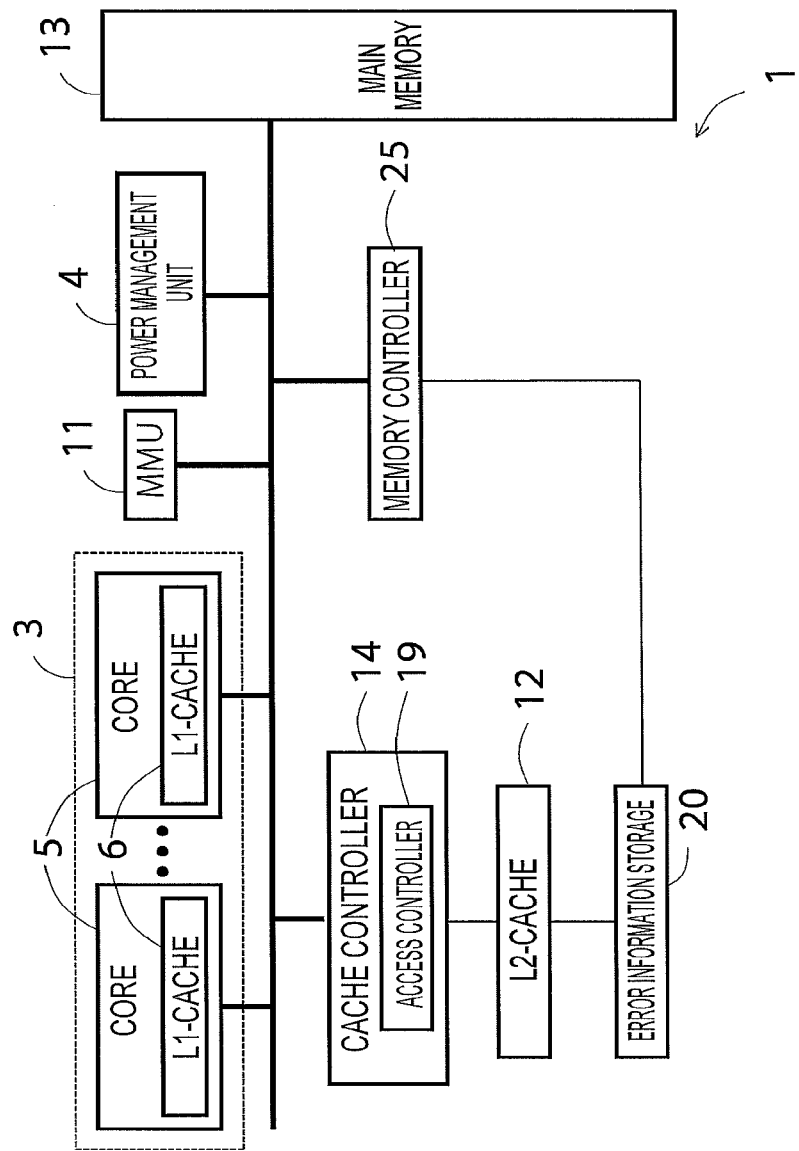
FIG. 21 is a block diagram schematically showing the configuration of a processor system provided with a memory system according to a fourth embodiment.

FIG. 21 is a block diagram schematically showing the configuration of a processor system 2 provided with a memory system 1 according to a fourth embodiment. The processor system 2 of FIG. 21 is provided with a processor 3, a power management unit 4, a memory controller 25, an L2-cache 12, and a main memory 13. The processor 3 has, for example, a plurality of cores 5. Each core 5 has a built-in L1-cache 6. The L2-cache 12 may be configured with a non-volatile memory such as an MRAM or a volatile memory such as an SRAM.

The main memory 13 is configured with a non-volatile memory. The non-volatile memory with which the main memory 13 is configured is, for example, an MRAM.

The memory system 1 of FIG. 21 is provided with an error information storage 20 like the second and third embodiments. In other words, the error information storage 20 according to the fourth embodiment stores stuck flag information indicating a result of initial screening before shipping the non-volatile memory and information on error times after shipping the non-volatile memory. In the present embodiment, the error information storage 20 is referred to when performing writing to and reading from the main memory 13.

Figure 22:
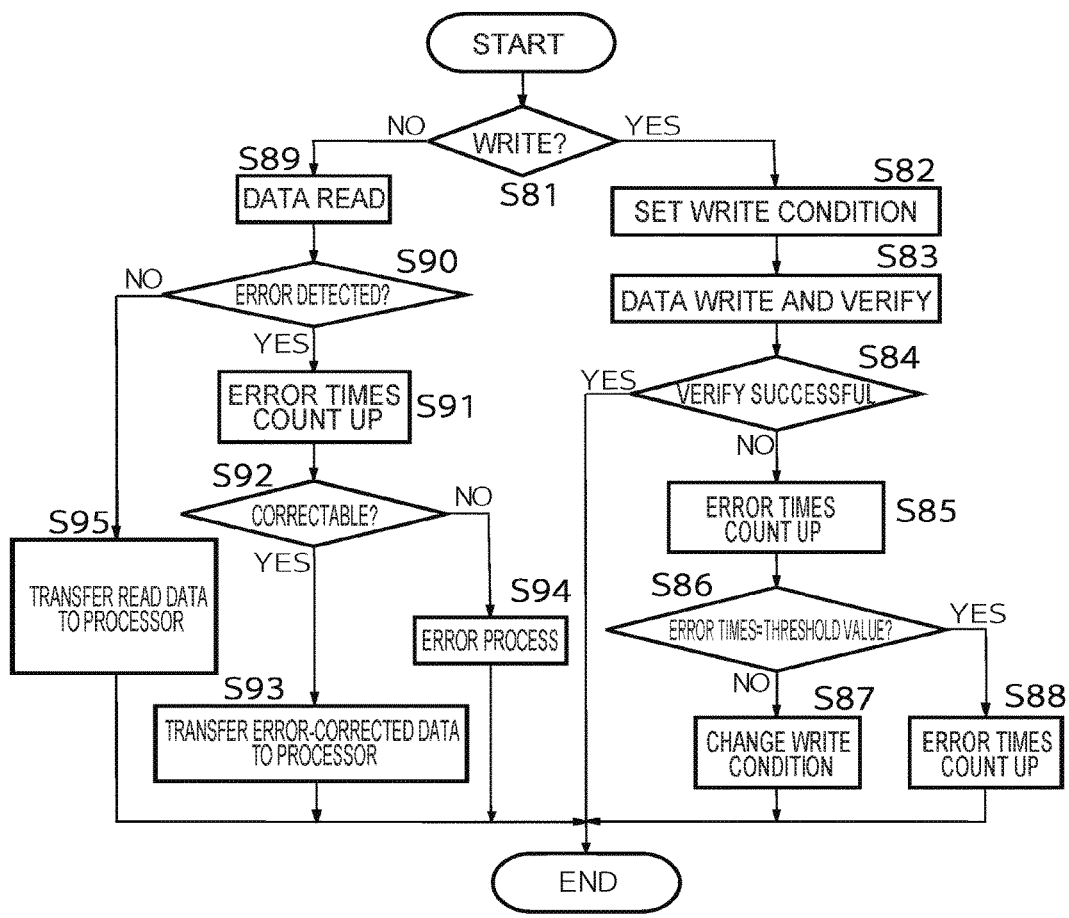
FIG. 22 is a flowchart showing a process of writing to and reading from a main memory.

FIG. 22 is a flowchart showing a process of writing to and reading from the main memory 13. First of all, it is determined whether to perform writing to the main memory 13 (step S81). When to perform writing, a write condition is set based on at least one of the stuck flag information or the number of error times both stored in the error information storage 20 (step S82). The write condition includes at least a write voltage, a write pulse width, a write current, the number of write times, temperature, or magnetic fields.

Subsequently, data is written in the main memory 13 under the write condition set in step S82 and verification to read the written data is performed (step S83). Subsequently, it is determined whether the verification is successful (step S84). If the verification is successful, the process ends. If the verification is failed, the count value of the error times counter 21 for measuring the number of error times is counted up and, in parallel with this, the error times information stored in the error information storage 20 is updated (step S85).

Subsequently, it is determined whether the number of error times reaches a predetermined threshold value (step S86). If the number of error times does not reach the predetermined threshold value, the write condition is changed (step S87), and step S83 and the following steps are repeated. If the number of error times reaches the predetermined threshold value, a cache line to be written is replaced with a redundant line in the redundant circuitry 18 (step S88), and step S83 and the following steps are repeated.

If it is determined as reading in step S81, data is read from the main memory 13 in accordance with a read request from the processor 3 (step S89). The read data is sent to the error correction controller 15. Subsequently, it is determined whether the error correction controller 15 detects an error (step S90). If the error is detected, the count value of the error times counter 21 is counted up, and, in parallel with this, the error times information stored in the error information storage 20 is updated (step S91).

Subsequently, it is determined whether the detected error is correctable (step S92). If correctable, the error correction controller 15 performs error correction and transfers the error-corrected data to the processor 3 (step S93). If uncorrectable, an error process is performed (step S94).

If an error is not detected in step S90, the read data is transferred to the processor 3 (step S95).

If the L2-cache 12 is configured with the non-volatile memory, the error information storage 20 may also be referred to when performing writing to and reading from the L2-cache 12. In this case, the process like that in FIG. 8 may be performed.

As described above, in the fourth embodiment, if the main memory 13 is configured with the non-volatile memory, it is capable of storing the number of error times in data writing and reading in the error information storage 20 and of setting an appropriate write condition based on the stuck flag information and the error times information both stored in the error information storage 20. Accordingly, the reliability of writing to and reading from the main memory 13 can be improved.

In the above-described first to fourth embodiments, writing may be performed two times or more in the case of writing to a cache line in which a correctable error is found by means of the stuck flag information in the error information storage 20. By performing a plurality of times of writing, the probability of occurrence of write errors can be reduced.

In the above-described first to fourth embodiments, the access controller 19 in the cache controller 12 may perform a process in which, if an error rate at which "1" is read when "0" is written in a memory cell in the non-volatile memory is higher than an error rate at which "0" is read when "1" is written in the memory cell, and if it is required to write "0", "0" is inverted to "1" and the inverted "1" is written in the non-volatile memory, and then the logic is inverted when the associated data is read from the non-volatile memory. In this way, data can be written in the non-volatile memory with logic of smaller error rate even if the error rate is different depending on the data logic, so that the write reliability to the non-volatile memory can be improved.

In the above-described first to third embodiments, for a cache line in which no write or read errors occur even if a predetermined period of time passes after the stuck flag information in the error information storage 20 is updated, the associated number of error times may be count down.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
a non-volatile memory comprising a first area to store readable and writable data and a second area to store an error correction code to be used for correcting an error of data stored in the first area;
an error corrector to correct an error included in data read from the non-volatile memory;
an error information storage, based on an error rate when a predetermined number or more of data is written in the non-volatile memory and read therefrom, to store first information on whether there is an error in the written data, on whether there is an error correctable by the error corrector in the written data, and on whether there is an error uncorrectable by the error corrector in the written data;
an access controller, based on the first information, to control at least one of reading from or writing to the non-volatile memory;
an error times counter to count error times in at least one of reading from or writing to the non-volatile memory after the first information is stored in the error information storage; and
an area size adjuster, based on second information on the error times, to adjust a size of the second area in the non-volatile memory,
wherein the error information storage stores the second information, in addition to the first information,
wherein the non-volatile memory comprises a set associative configuration including a plurality of ways, and
wherein the area size adjuster adjusts the size of the second area per way for one set of the non-volatile memory based on the second information.

2. The memory system of claim 1, wherein the non-volatile memory comprises a plurality of memory cells,
wherein the access controller performs at least one of reading from or writing to the non-volatile memory per predetermined number of the memory cells,
wherein the error information storage stores the first information based on the error rate of data repeatedly written in the predetermined number of the memory cells, by a predetermined number of times.

3. The memory system of claim 1, wherein the access controller performs data writing to the non-volatile memory under a first condition when acquiring the error rate and, after the first information is stored in the error information storage, performs data writing, based on the first information, to the non-volatile memory under a second condition with a lower write reliability than the first condition.

4. The memory system of claim 1, wherein the non-volatile memory comprises a plurality of memory cells,
wherein the non-volatile memory comprises a redundant cell replaceable with a part of the plurality of memory cells,
wherein, when reading data stored in the non-volatile memory, based on the first information, the access controller reads the data stored in the non-volatile memory without correcting the data by the error corrector, reads the data stored in the non-volatile memory after the data is corrected by the error corrector, or replaces the data stored in the non-volatile memory with the redundant cell.

5. The memory system of claim 1, wherein the error information storage is provided in the non-volatile memory.

6. The memory system of claim 1 further comprising a main memory provided apart from the non-volatile memory, wherein the error information storage is provided in the main memory.

7. The memory system of claim 1 further comprising a main memory provided apart from the non-volatile memory, wherein the error information storage is provided apart from the non-volatile memory and the main memory.

8. The memory system of claim 1 wherein, based on the first information, the access controller controls at least one of a write voltage, a write pulse width, a write current, write times, temperature, or magnetic fields, in data writing to the non-volatile memory.

9. The memory system of claim 1,
based on the first and second information, the access controller controls at least one of a write voltage, a write pulse width, a write current, write times, temperature, or magnetic fields, in data writing to the non-volatile memory.

10. The memory system of claim 1 wherein the non-volatile memory is a cache memory for at least one of data reading or writing per cache line,
wherein the error information storage stores the first and second information per cache line,
one of the ways comprises a data bit length of the cache line, and
the area size adjuster adjusts the size of the second area per cache line.

11. The memory system of claim 1 wherein the area size adjuster shifts the second area in the non-volatile memory based on the second information.

12. The memory system of claim 11 wherein the area size adjuster shifts the second area in the non-volatile memory based on the second information when the error times reach predetermined times.

13. The memory system of claim 1 wherein the non-volatile memory comprises a plurality of memory cells, and
wherein when an error rate that first-logic data written to the memory cell in the non-volatile memory is erroneously read out as second-logic data having inversion logic of the first-logic data is higher than an error rate that the second-logic data written to the memory cell is erroneously read out as the first-logic data, the access controller writes the second-logic data in the memory cell, and inverts a logic of the second-logic data read out from the memory cell.

14. The memory system of claim 1 wherein the non-volatile memory comprises an MRAM (Magnetoresistive Random Access Memory).

15. A memory system comprising:
a non-volatile memory comprising a first area to store readable and writable data and a second area to store an error correction code to be used for correcting an error of data stored in the first area;
an error corrector to correct an error included in data read from the non-volatile memory;
an error information storage, based on an error rate when a predetermined number or more of data is written in the non-volatile memory and read therefrom, to store first information on whether there is an error in the written data, on whether there is an error correctable by the error corrector in the written data, and on whether there is an error uncorrectable by the error corrector in the written data;
an access controller, based on the first information, to control at least one of reading from or writing to the non-volatile memory;
an error times counter to count error times in at least one of reading from or writing to the non-volatile memory after the first information is stored in the error information storage; and
an area size adjuster, based on second information on the error times, to adjust a size of the second area in the non-volatile memory,
wherein the error information storage stores the second information, in addition to the first information,
wherein the non-volatile memory comprises a set associative configuration including a plurality of ways,
wherein the first and second information are set per way for one set, and
wherein the second information identifies a way allocated as the second area for one set.

16. The memory system of claim 15 wherein the area size adjuster shifts the second area in the non-volatile memory based on the second information.

17. The memory system of claim 16 wherein the area size adjuster shifts the second area in the non-volatile memory based on the second information when the error times reach predetermined times.

18. The memory system of claim 15 wherein the non-volatile memory comprises a plurality of memory cells, and
wherein when an error rate that first-logic data written to the memory cell in the non-volatile memory is erroneously read out as second-logic data having inversion logic of the first-logic data is higher than an error rate that the second-logic data written to the memory cell is erroneously read out as the first-logic data, the access controller writes the second-logic data in the memory cell, and inverts a logic of the second-logic data read out from the memory cell.

19. The memory system of claim 15 wherein the non-volatile memory comprises an MRAM (Magnetoresistive Random Access Memory).

* * * * *